(12) United States Patent
Imakita et al.

(10) Patent No.: US 8,702,913 B2
(45) Date of Patent: Apr. 22, 2014

(54) FILM FORMING APPARATUS AND FILM FORMING METHOD

(75) Inventors: Kenichi Imakita, Tsukuba (JP); Tadashi Morita, Tsukuba (JP); Hiroki Yamamoto, Susono (JP); Naoki Morimoto, Susono (JP); Ayao Nabeya, Susono (JP); Shinya Nakamura, Loyang Way (SG)

(73) Assignee: Ulvac, Inc., Kanagawa (JP)

( * ) Notice: Subject to any disclaimer, the term of this patent is extended or adjusted under 35 U.S.C. 154(b) by 371 days.

(21) Appl. No.: 12/681,464

(22) PCT Filed: Sep. 29, 2008

(86) PCT No.: PCT/JP2008/067660
§ 371 (c)(1),
(2), (4) Date: Apr. 2, 2010

(87) PCT Pub. No.: WO2009/044705
PCT Pub. Date: Apr. 9, 2009

(65) Prior Publication Data
US 2010/0236918 A1    Sep. 23, 2010

(30) Foreign Application Priority Data
Oct. 4, 2007  (JP) .................. 2007-261286

(51) Int. Cl.
*C23C 14/34* (2006.01)
(52) U.S. Cl.
USPC .............. 204/192.13; 204/192.12; 204/192.2
(58) Field of Classification Search
USPC ............. 204/298.18, 298.2, 298.23, 298.28, 204/192.12, 192.13, 192.2
See application file for complete search history.

(56) References Cited

U.S. PATENT DOCUMENTS

| 2005/0067389 A1 | 3/2005 | Greer et al. |
| 2007/0080059 A1 | 4/2007 | Takahashi |
| 2009/0294279 A1 | 12/2009 | Kikuchi et al. |

FOREIGN PATENT DOCUMENTS

| JP | 01-279752 | 11/1989 |
| JP | 10-147863 | 6/1998 |
| JP | 2000-319096 | 11/2000 |
| JP | 2004-339547 | 12/2004 |
| JP | 2006-111927 | 4/2006 |
| JP | 2007-100183 | 4/2007 |
| WO | WO 2006/077837 A1 | 7/2006 |

OTHER PUBLICATIONS

Machine Translation of Japanese 2000-319096 dated Nov. 2000.*
Yuasa, Shinji, et al., "Giant room-temperature magnetoresistance in single-crystal Fe/MgO/Fe magnetic tunnel junctions," *nature materials*, vol. 3, pp. 868-871 (Dec. 2004).

* cited by examiner

*Primary Examiner* — Rodney McDonald
(74) *Attorney, Agent, or Firm* — Christensen Fonder P.A.

(57) ABSTRACT

A film formation apparatus and film formation method that improve film thickness uniformity. A rotation mechanism holds a target having a sputtered surface in a state inclined relative to a surface of a substrate. The rotation mechanism rotatably supports the target about an axis extending along a normal of the sputtered surface. The target supported by the rotation mechanism is sputtered to form a thin film on the surface of the substrate. When forming the thin film, the rotation mechanism maintains the rotational angle of the target.

6 Claims, 3 Drawing Sheets

FILM FORMING APPARATUS AND FILM FORMING METHOD

PRIORITY CLAIM

The present application is a National Phase entry of PCT Application No. PCT/JP2008/067660, filed Sep. 29, 2008, which claims priority from Japanese Patent Application Number 2007-261286, filed Oct. 4, 2007, the disclosures of which are hereby incorporated by reference herein in their entirety.

TECHNICAL FIELD

The present invention relates to a film formation apparatus and a film formation method.

BACKGROUND ART

A magnetic device, which uses a giant magnetic resistive (GMR) effect and a tunneling magnetoresistive (TMR) effect, includes a magnetoresistive element formed from an artificial grading multilayer film having about six to fifteen layers. The magnetoresistive element includes a fixing layer, which fixes the direction of spontaneous magnetization, a free layer, which rotates in the spontaneous magnetization direction, and a nonmagnetic layer, which is arranged between the fixing layer and the free layer.

The output characteristics of a magnetic device are greatly dependent on the electric resistance value of the magnetoresistive element. The electric resistance varies greatly in accordance with the thickness of each of the nonmagnetic layer, free layer, fixing layer, and the like. For example, when using an MgO layer as the nonmagnetic layer, even a slight change of 0.1 nm in the thickness of the MgO layer would vary the resistance value by 50% or greater (non-patent document 1). Thus, in a magnetic device using a GMR element or a TMR element, the thickness of each layer must be highly accurate to stabilize the output characteristics of the magnetic device.

A sputtering apparatus is widely used as a film formation apparatus for each layer of the artificial lattice multilayer film. The sputtering apparatus sputters a sputtering target (hereinafter, simply referred to as the target) and deposits sputter grains dispersed from the target onto a substrate. To improve the thickness uniformity of a thin film, there are sputtering apparatuses that incline a target surface relative to a substrate surface, turn the target around the substrate, or swing the target relative to the substrate (for example, patent document 1 and patent document 2). In such cases, the sputter grains dispersed from the target strikes the substrate from different angles. Thus, the sputter grains may be further uniformly deposited throughout the entire substrate surface.

When performing sputtering, the thickness uniformity of a thin film varies greatly in accordance with the discharge state or plasma density of a plasma discharge area above a substrate. The discharge state or plasma density above the substrate varies in accordance with the position of each point on the target surface relative to the substrate. For example, the trajectory of a sputter grain relative to the substrate and the density of the sputter grains vary in accordance with the coupling angle of the target in a circumferential direction.

During a single film formation process, the turning or swinging of the target is performed by combining a coupling angle having a high thickness uniformity and a coupling angle having a low thickness uniformity so that the film thickness between substrates becomes uniform. Thus, during a single film formation process, a thin film having low thickness uniformity may be formed. This makes it difficult to sufficiently improve the thickness uniformity of the thin film.

Non-Patent Document 1: Nature Mater. 3 (2004)868
Patent Document 1: Japanese Laid-Open Patent Publication No. 2004-339547
Patent Document 2: Japanese Laid-Open Patent Publication No. 2006-111927

SUMMARY OF THE INVENTION

The present invention provides a film formation apparatus and a film formation method that improve the film thickness uniformity.

A first aspect of the present invention is a film formation apparatus. The film formation apparatus sputters a target having a sputtered surface inclined relative to a surface of a substrate to form a thin film on the surface of the substrate. The film formation apparatus includes a rotation mechanism that holds the target rotatably about an axis extending along a normal of the sputtered surface and maintains a rotational angle of the target when the thin film is formed.

A second aspect of the present invention is a film formation method. The film formation method sputters a target having a sputtered surface inclined relative to a surface of a substrate to form a thin film on the surface of the substrate. The method includes rotating the target with a rotation mechanism about an axis extending along a normal of the sputtered surface, and sputtering the target while maintaining a rotational angle of the target at a constant value with the rotation mechanism.

A third aspect of the present invention is a film formation method. The film formation method sputters a target having a sputtered surface inclined relative to a surface of a substrate to form a thin film on the surface of the substrate. The method includes a test sputtering process, which includes changing a rotational angle of the target by driving a rotation mechanism that rotates the target about an axis extending along a normal of the sputtered surface, sputtering the target at each of a plurality of different rotational angles to form a plurality of different thin films, and determining a target value for the rotational angle based on film thickness uniformity of the plurality of thin films. The method further includes a main sputtering process, which includes driving the rotation mechanism to set the rotational angle of the target at the target value, and sputtering the target while maintaining the rotational angle of the target at the target value to form the thin film on the surface of the substrate.

DETAILED DESCRIPTION OF THE EMBODIMENTS

Physical properties such as stress or strain remaining in a target, crystal orientation, and crystal grain diameter, are affected by rolling procedures in a manufacturing process of the target. Thus, a plane of the target has anisotropy. The inventors of the present invention have found that since such anisotropy of the target varies the discharge state or the plasma density, the film thickness distribution of a thin film is cyclic in relation to the coupling angle of the target.

Figure 1:
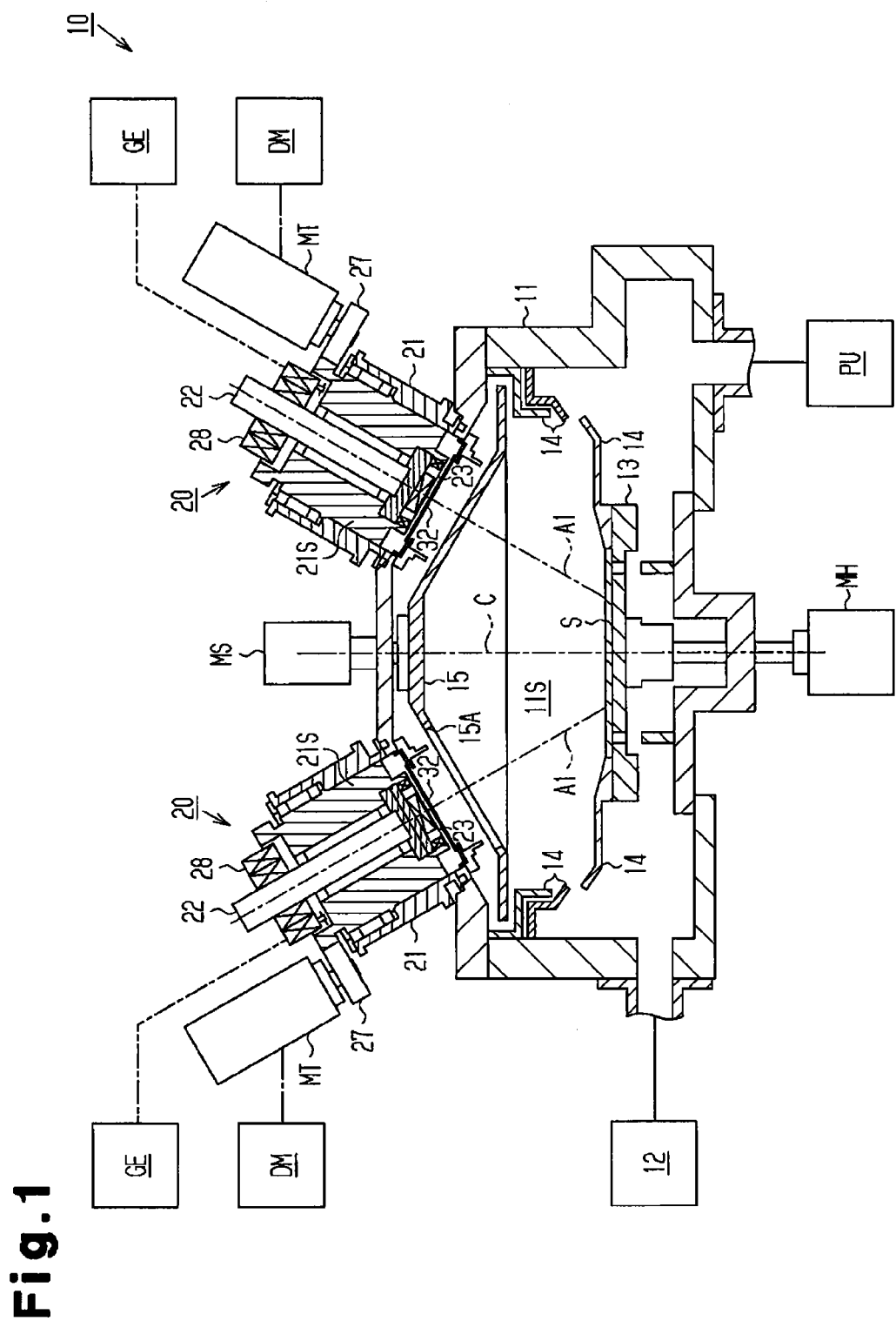
FIG. 1 is a cross-sectional diagram schematically showing a sputtering apparatus.
Figure 2:
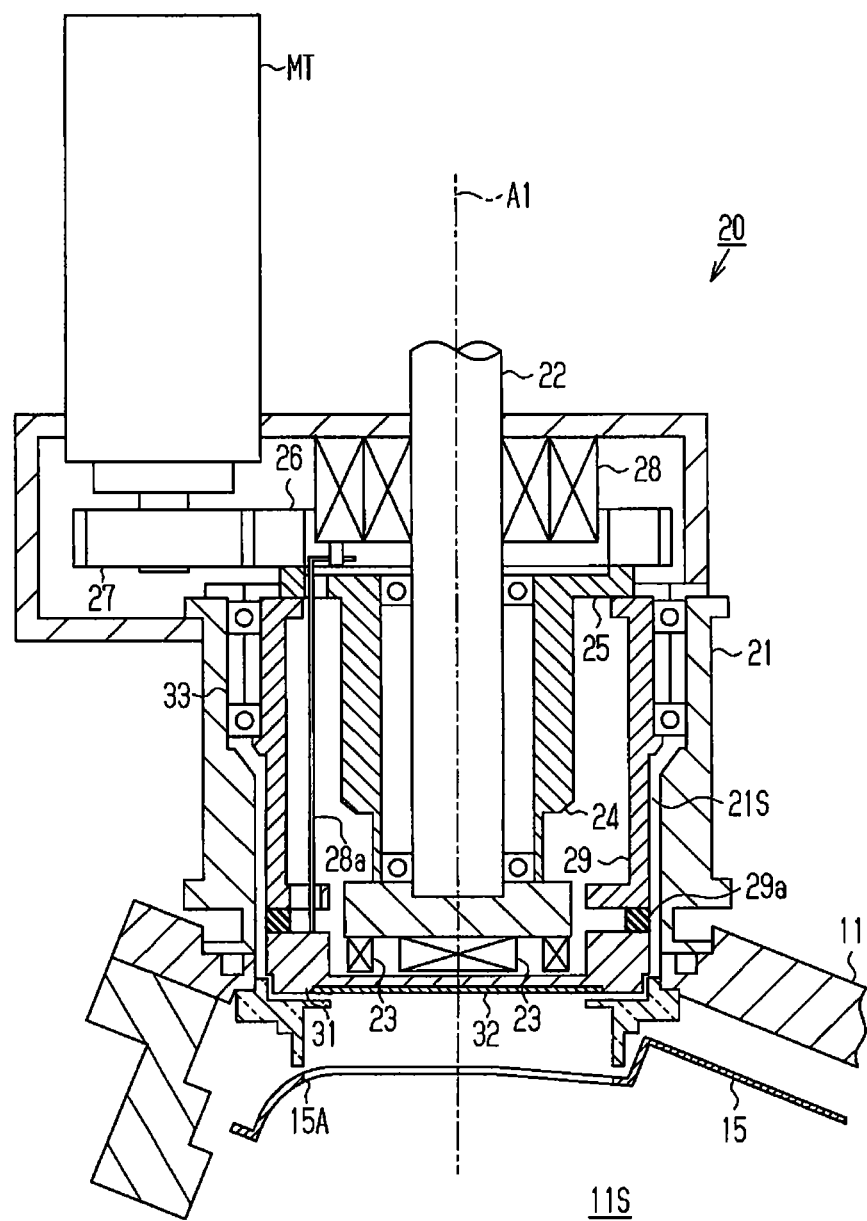
FIG. 2 is a cross-sectional diagram showing the interior of a cathode.

A film formation apparatus according to one embodiment of the present invention will now be discussed with reference to the drawings. FIG. 1 is a cross-sectional side view schematically showing a sputtering apparatus 10, which serves as a film formation apparatus. FIG. 2 is a schematic cross-sectional diagram showing a cathode 20.

[Film Formation Apparatus]

Referring to FIG. 1, the sputtering apparatus 10 includes a vacuum tank (hereinafter simply referred to as the chamber body 11) connected to an exhaust system PU, which is formed by a vacuum pump or the like. A substrate S, which is conveyed from outside, is loaded into an internal area (hereinafter simply referred to as the film formation area 11S) of the chamber body 11. The substrate S may be, for example, a disc-shaped silicon substrate, glass substrate, or AlTiC substrate.

The chamber body 11 is connected to a gas supply system 12, which supplies sputter gas, and is supplied with sputter gas at a predetermined flow rate. The sputter gas may be Ar, Kr, Xe, or the like. Further, the sputter gas may include reaction gas of nitrogen, carbon monoxide, or the like.

A substrate holder 13, which holds a substrate S, is arranged in the film formation area 11S. The substrate holder 13 positions and fixes the substrate S, which is loaded into the chamber body 11, at a predetermined position. The substrate holder 13 is connected to a drive shaft of a holder motor MH, which is arranged below the chamber body 11. The substrate holder 13 receives drive force from the holder motor MH to rotate the substrate S about the center of the substrate S. In the present embodiment, a vertical line including the center of the substrate S is referred to as the center axis C.

A plurality of screen plates 14 are arranged in the film formation area 11S to cover the outer circumferential surface of the substrate holder 13 and the inner circumferential surface of the chamber body 11. The screen plates 14 prevent sputter grains from collecting on the outer circumferential surface of the substrate holder 13 and the inner wall of the chamber body 11.

A dome-shaped shutter plate 15 covering the upper side of the substrate holder 13 is arranged in the film formation area 11S. The shutter plate 15 is a plate partitioning an upper side and a lower side of the film formation area 11S. A round hole (hereinafter simply referred to as the opening 15A) extends through the shutter plate 15 between the upper side and lower side of the film formation area 11S. The shutter plate 15 is connected to a drive shaft of a shutter motor MS, which is arranged above the chamber body 11. The shutter plate 15 receives drive force from the shutter motor MS and rotates about the center axis C. Thus, the shutter plate 15 rotates the opening 15A about the center axis C.

A plurality of cathodes 20 are arranged at the upper side of the chamber body 11. The cathodes 20 each include a cylindrical housing 21, which extends in a direction intersecting the center axis C. Each housing 21 has an internal area (hereinafter referred to as the rotation area 21S), which is connected to the chamber body 11 and is in communication with the film formation area 11S.

In the present embodiment, the center line of each housing 21, specifically, each single-dashed line that is not the center axis C in FIG. 1, is referred to as the cathode axis A1. The angle formed by the cathode axis A1 and the center axis C is referred to as a diagonal incident angle.

Each housing 21 includes a rotation shaft 22, which extends along the corresponding cathode axis A1. Each rotation shaft 22 has a lower end connected to a magnetic circuit 23. Each rotation shaft 22 is connected to a drive shaft of a magnetic circuit motor (not shown) and receives drive force from the magnetic circuit motor to rotate the magnetic circuit 23 around the cathode axis A1. Each magnetic circuit 23 is a magnetic circuit that forms a magnetron magnetic field below the corresponding cathode 20 and receives the drive force of the rotation shaft 22 to rotate the magnetron magnetic field around the cathode axis A1.

Referring to FIG. 2, a cylindrical tube (hereinafter referred to as the inner tube 24) is arranged on and rotatably supported by the outer surface of the rotation shaft 22 in the rotation area 21S. The inner tube 24 has an upper end from which a flange 25 extends outward in the radial direction of the rotation shaft 22. A cylindrical gear (hereinafter referred to as the driven gear 26), which rotates about the cathode axis A1, is coupled to the upper side of the flange 25. A drive gear 27, which is mated with the driven gear 26, is arranged at the outer side (left side as viewed in FIG. 2) of the driven gear 26.

The drive gear 27, which is connected to a drive shaft of a target motor MT, receives drive force from the target motor MT to rotate the driven gear 26 about the cathode axis A1. The inner tube 24 rotates about the cathode axis A1 when receiving the drive force of the target motor MT from the driven gear 26 and the drive gear 27.

The target motor MT is, for example, a stepping motor or servo motor that rotates its drive shaft forward or reverse by a predetermined rotational angle. Further, the target motor MT is connected to a motor drive unit DM (refer to FIG. 1). The motor drive unit DM generates a drive signal (for example, a pulse signal), which rotates the drive shaft of the target motor MT by a predetermined rotational angle, and sends the drive signal to the target motor MT. In response to the drive signal from the motor drive unit DM, the target motor MT rotates the drive shaft by a predetermined rotational angle and then maintains the rotational angle. When receiving the drive force of the target motor MT, the inner tube 24 is rotated about the cathode axis A1 by a predetermined rotational angle and then positioned in the state subsequent to the rotation.

In the present embodiment, the position of the inner tube 24 as viewed in the axial direction of the cathode axis A1 when the target motor MT is in an initial position is referred to as the reference position. Further, the rotational amount (rotational angle) of the inner tube 24 relative to the reference position is referred to as a target angle $\theta(0<\theta \leq 360°$, which is a rotational angle.

A slip ring 28, which is connected to an external power supply GE (refer to FIG. 1), is arranged on the periphery of the rotation shaft 22 at the upper side of the inner tube 24. The slip ring 28 includes an output terminal 28a, which extends through the flange 25 and through the rotation area 21S. The external power supply GE generates predetermined DC power or high-frequency power for initiating discharging and sends the power to the slip ring 28. The slip ring 28 receives power from the external power supply GE and sends the power to the output terminal 28a.

A cylindrical tube (hereinafter simply referred to as the outer tube 29), which is rotatably supported at the inner side of the housing 21, is connected to the outer side of the inner tube 24 in the rotation area 21S. The outer tube 29 is connected to the drive shaft of the target motor MT via the inner tube 24, the driven gear 26, and the drive gear 27. When receiving the drive force of the target motor MT, the outer tube 29 is rotated about the cathode axis A1 by the rotational amount of the inner tube 24, that is, the target angle $\theta$, and then positioned in the state subsequent to the rotation.

The outer tube 29 has a lower end to which a backing plate 31 is attached by way of a seal 29a. The backing plate 31 is generally disc-shaped, has a center that lies along the cathode axis A1, and is arranged to cover the lower side of the magnetic circuit 23. The backing plate 31 holds a generally disc-shaped target 32, which has a center that lies along the cathode axis A1, at the opposite side of the magnetic circuit 23. The backing plate 31 is connected to the output terminal 28a of the slip ring 28, receives power from the output terminal 28a, and sends the power to the target 32.

In the present embodiment, the surface of the target 32 exposed to the interior of the film formation area 11S is referred to as a sputtered surface.

A magnetic seal 33 is arranged between the outer tube 29 and the housing 21. The magnetic seal 33 shields the space between the outer tube 29 and the housing 21 in the rotation area 21S from ambient air. The housing 21 rotatably supports the outer tube 29 with the magnetic seal 33 and shields the portion of the rotation area 21S that is in communication with the film formation area 11S from ambient air.

The target 32 is connected to the drive shaft of the target motor MT by the backing plate 31, the outer tube 29, the inner tube 24, the driven gear 26, and the drive gear 27. When receiving the drive force of the target motor MT, the target 32 is rotated about the cathode axis A1 by the rotational angle of the inner tube 24, that is, the target angle $\theta$, and then positioned in the state subsequent to the rotation.

When forming a thin film on the substrate S, the sputtering apparatus 10 drives the target motor MT and sets the target angle $\theta$ to a preselected angle (hereinafter simply referred to as the target value). Then, the sputtering apparatus 10 sets the substrate S on the substrate holder 13 and rotates the substrate S about the center axis C. The sputtering apparatus 10 drives the exhaust system PU and the gas supply system 12 to supply the film formation area 11S with sputter gas and adjust the film formation area 11S to a predetermined pressure. Further, the sputtering apparatus 10 drives the shutter motor MS to rotate the shutter plate 15 so that the opening 15A of the shutter plate 15 faces toward the target 32. Then, the sputtering apparatus 10 drives the magnetic circuit 23 to form a magnetron magnetic field on the surface of the target 32 and drives the external power supply GE to supply the target 32 with predetermined power.

This sputters the target 32, which is at the target angle $\theta$, and forms a film thickness distribution in accordance with the target angle $\theta$. In this case, regardless of the initial setting state of the target 32, the sputtering apparatus 10 selects the target angle $\theta$ and selects the relative position of each point on the sputtered surface as viewed from each point on the substrate S. For example, the sputtering apparatus 10 selects the target angle $\theta$ to select the direction of anisotropy of the target 32 as viewed from each point on the substrate S. Thus, since the relative position of the target 32 as viewed from each point on the substrate S may be selected, such as the direction of anisotropy or the like of the target 32, the sputtering apparatus 10 improves the thickness uniformity of the thin film on the substrate S.

In the present embodiment, a rotation mechanism is formed by the target motor MT, the drive gear 27, the driven gear 26, the inner tube 24, the outer tube 29, and the backing plate 31.

[Film Formation Process]

Figure 3A:
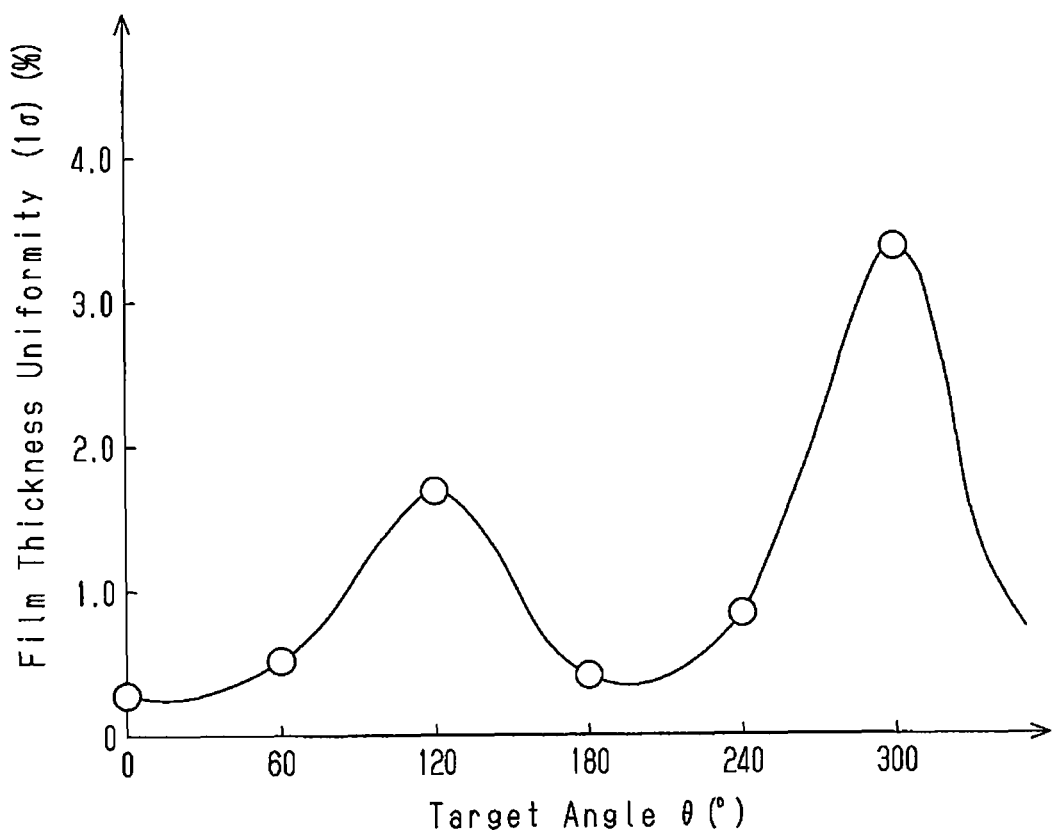
FIG. 3A is a chart showing the relationship of the target angle and the film thickness uniformity.
Figure 3B:
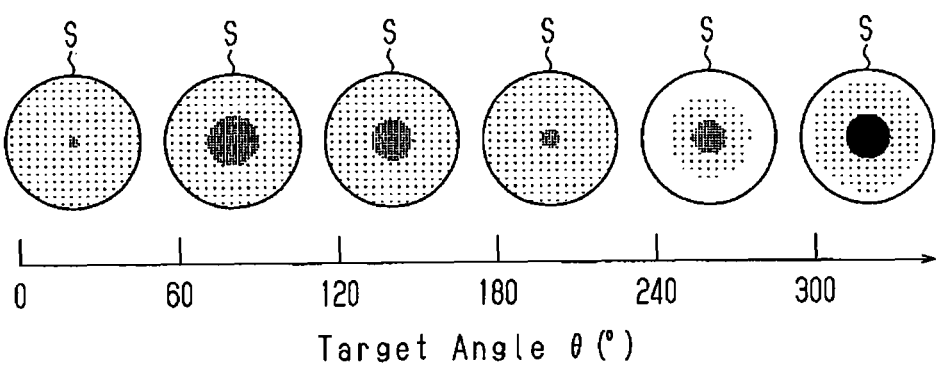
FIG. 3B is a chart showing the relationship of the target angle and the film thickness distribution.

A film formation process using the sputtering apparatus 10 will now be discussed. First, the cyclicity of the film thickness distribution in relation to the target angle $\theta$ will be discussed. A round and flat tantalum (hereinafter, Ta) target is used. The chart of FIG. 3A shows the thickness uniformity of the Ta film for each target angle $\theta$ obtained through film formation that is performed under the conditions listed below. The film thickness distribution of the Ta film for each target angle $\theta$ is shown in FIG. 3B.

In FIG. 3A, the thickness uniformity of the Ta film was calculated based on measurement results of a sheet resistance of the Ta film under the presumption that the electrical resistivity of the Ta film is constant in a plane of the substrate S. Further, in FIG. 3B, thick portions are darkly shaded, and thin portions are lightly shaded.

[Film Formation Condition]
substrate S: silicon substrate having an eight-inch diameter
target diameter: 152 nm
diagonal incident angle: 22°
sputter gas: Ar
sputter pressure: $2.4 \times 10^{-2}$ Pa
DC power: 2.44 W/cm$^2$ As shown in FIG. 3, when the target angle $\theta$ is 0°, the film thickness uniformity is approximately 0.3%. Further, as the target angle $\theta$ increases from 0° to 120°, the film thickness uniformity increases to approximately 1.7%. During this period, with regard to the film thickness distribution, an increase in the target angle $\theta$ gradually increases the relative film thickness at the central portion of the substrate S.

When the target angle $\theta$ is 180°, the film thickness uniformity is approximately 0.4%. Further, as the target angle $\theta$ increases from 180° to 300°, the film thickness uniformity increases to approximately 4.3%. This tendency is the same as from 0° to 120°. During this period, with regard to the film thickness distribution, an increase in the target angle $\theta$ gradually increases the relative film thickness at the central portion of the substrate S. This tendency is the same as from 0° to 120°

More specifically, the tendency of the film thickness distribution when the target angle $\theta$ is 0° to 180° and the tendency of the film thickness distribution when the target angle $\theta$ is 180° to 360° are almost the same. Further, the film thickness uniformity and the film thickness distribution have the same tendency (cyclicity) in cycles of 180° relative to the target angle $\theta$.

Due to rolling or the like in a manufacturing process of the target 32, the residual stress in the target 32, the strain applied to the target 32, the crystal orientation, the crystal grain diameter, and the like may not be uniform in the plane of the target 32 and are thus anisotropic. When performing sputtering with such a target 32, the discharge state or plasma density in a plasma discharge area differs between the central portion of the substrate S and the peripheral portion of the substrate S. As a result, the film thickness distribution of the thin film formed on the substrate S differs depending on the relative positional relationship of each point on the substrate S and each point on the target 32, namely, the target angle $\theta$. Thus, cyclicity appears in the film thickness distribution of the thin film in accordance with the direction of anisotropy of the target 32.

In the film formation process that uses the sputtering apparatus 10, test sputtering is conducted to determine the target value of the target angle $\theta$ before forming a thin film on the substrate S (before performing the main sputtering process).

More specifically, the sputtering apparatus 10 first drives the target motor MT to set the target angle $\theta$ at a predetermined angle (hereinafter referred to as the test sputtering angle) within the range of $0 < \theta \le 360°$. Then, film formation is performed at the test sputtering angle on the substrate S, and the film thickness distribution for the test sputtering angle is measured. The sputtering apparatus 10 measures the film thickness distribution for different test sputtering angles in the range of $0 < \theta \le 360°$, and the test sputter angle at which the film thickness uniformity becomes less than or equal to a predetermined value is determined as the target value.

For example, the sputtering apparatus 10 drives the target motor MT to set the test sputtering angle at 0°, performs film formation on the test sputtering substrate S at the test sputtering angle, and measures the film thickness distribution at 0°. Then, the sputtering apparatus 10 sets the test sputtering angle in the order of 60°, 120°, 180°, 240°, and 360°, measures the film thickness distribution for each test sputtering angle, and determines the target value as the test sputtering angle at which the film thickness uniformity becomes a predetermined value or less based on the cyclicity of the film thickness distribution. In FIG. 3A, the target value is determined in the ranges of 0° to 60° or 180° to 240°.

This allows for the determination of the target value within a film thickness distribution range that is common to a plurality of test sputtering angles. Further, in addition to improving the film thickness uniformity, the reproducibility is improved with regard to the location of thick portions and the location of thin portions in the plane of the substrate S.

After determining the target value through the test sputtering, the sputtering apparatus 10 drives the target motor MT, sets the target angle θ as the target value, and then performs the main sputtering.

More specifically, the sputtering apparatus 10 sets a substrate S on the substrate holder 13, rotates the substrate S around the center axis C, and drives the exhaust system PU and the gas supply system 12 to supply the film formation area 11S with sputter gas. Further, the sputtering apparatus 10 drives the shutter motor MS to rotate the shutter plate 15 so that the opening 15A of the shutter plate 15 faces toward the target 32. The sputtering apparatus 10 then drives the magnetic circuit 23 to form a magnetron magnetic field on the surface of the target 32 and drives the external power supply GE to supply the target 32 with predetermined power.

This sputters the target 32 at the target angle θ, which is set at the target value, and forms a film having thickness uniformity on the substrate S in accordance with the target value.

The sputtering apparatus 10 of the present embodiment has the advantages described below.

(1) In the above-described embodiment, the target motor MT rotates the target 32 about the cathode axis A1, which extends along a normal of the sputtered surface, with the drive gear 27, the driven gear 26, the outer tube 29, and the backing plate 31. Further, the target motor MT maintains the target 32 at the target angle θ when performing the test sputtering process and the main sputtering process.

Accordingly, regardless of the initial setting angle of the target 32, the rotation of the target 32 allows for selection of the relative position of each point on the sputtered surface as viewed from each point on the surface of the substrate S and allows for the selected relative position to be maintained.

More specifically, the sputtering apparatus 10 may select the anisotropy direction of the target 32 as viewed from each point on the substrate S and maintain the selected anisotropy direction. Thus, since the position of the target 32 relative to the substrate S may be selected, the sputtering apparatus 10 improves the thickness uniformity of the thin film on the substrate S.

(2) In the above-described embodiment, during the test sputtering process, the target 32 is sputtered at each of a plurality of different test sputtering angles to form a plurality of different thin films in accordance with each target 32. Further, the target value of the target angle θ is determined based on the thickness uniformity of the plurality of different thin films. In the sputtering process, the target motor MT is driven to maintain the target angle θ at the target value.

Accordingly, in the test sputtering process, the anisotropy direction of the target 32 relative to the substrate S is selected and determined. In the main sputtering process, the determined anisotropy direction is maintained. Thus, since the position of the target 32 relative to the substrate S may be selected, the sputtering apparatus 10 improves the thickness uniformity of the thin film on the substrate S.

(3) In the above-described embodiment, during the test sputtering process, the test sputtering angle at which the film thickness uniformity becomes a predetermined value or less is determined as the target value. Accordingly, during the main sputtering process, improvement in the thickness uniformity of the thin film is further ensured.

(4) In the above-described embodiment, during the test sputtering process, the target value is determined based on the cyclicity of the film thickness distribution, that is, the direction of anisotropy of the target 32. Accordingly, during the main sputtering process, variations are reduced in the location of thick portions and the location of thin portions in the plane of the substrate S.

The above-described embodiment may be modified as described below.

In the above-described embodiment, the test sputtering angle at which the film thickness uniformity becomes a predetermined value or less is determined as the target value. However, the present invention is not limited in such a manner. For example, among a plurality of test sputtering angles, the test sputtering angle at which the value of he film thickness uniformity becomes the lowest may be determined as the target value. Alternatively, based on the cyclicity of the film thickness distribution, the sputtering angle at which the film thickness uniformity may become the lowest may be determined as the target value.

In the above-described embodiment, the target 32 is rotated in one direction (the target angle θ is increased from 0° to 360°). However, the present invention is not limited in such a manner and may be applied to a structure that rotates the target 32 in the circumferential direction, that is, increases the target angle θ from 0° to 360° or decreases the target angle θ from 360° to 0°.

In the above-described embodiment, during the test sputtering process, the target angle θ is selected from the range of 0° to 360°. However, the present invention is not limited in such a manner, and in the test sputtering process, the target angle θ may be selected from the range of 0° to 180°. By restricting the range of the target angle θ to the range of 0° to 180°, the film thickness uniformity may be improved with a simpler structure.

The invention claimed is:

1. A film formation method that sputters a target having a sputtered surface inclined relative to a surface of a substrate to form a thin film on the surface of the substrate, the method comprising:
   a test sputtering process including:
      changing a rotational angle of the target by driving a rotation mechanism that rotates the target about an axis extending along a normal of the sputtered surface;
      sputtering the target at each of a plurality of different rotational angles to form a plurality of different thin films; and
      determining a constant target value for the rotational angle based on film thickness uniformity of the plurality of thin films; and
   a main sputtering process including:
      driving the rotation mechanism to set the rotational angle of the target at the constant target value; and sputtering the target while maintaining the rotational angle of the target at the constant target value, which is set in accordance with the target to be sputtered, until the main sputtering process to form the thin film using the target on the surface of the substrate is completed.

2. The film formation method according to claim 1, wherein said determining a constant target value includes:
determining the constant target value as one of the plurality of rotational angles at which the film thickness uniformity is less than or equal to a predetermined value.

3. The film formation method according to claim 1, wherein said determining a constant target value includes:
detecting anisotropy of the target in relation to film thickness distribution of the thin film based on the film thickness uniformity of the plurality of thin films to determine the constant target value of the rotational angle.

4. The film formation method according to claim 3, wherein said changing a rotational angle includes:
changing the rotational angle within a range of 0° to 180°.

5. The film formation method according to claim 2, wherein said determining a constant target value includes:
detecting anisotropy of the target in relation to film thickness distribution of the thin film based on the film thickness uniformity of the plurality of thin films to determine the constant target value of the rotational angle.

6. The film formation method according to claim 5, wherein said changing a rotational angle includes:
changing the rotational angle within a range of 0° to 180°.

\* \* \* \* \*